(12) United States Patent  (10) Patent No.: US 9,107,009 B2
Pan et al.  (45) Date of Patent: Aug. 11, 2015

(54) SILICON CONDENSER MICROPHONE

(71) Applicants: Xu-dong Pan, Shenzhen (CN);
Jian-quan Li, Shenzhen (CN)

(72) Inventors: Xu-dong Pan, Shenzhen (CN);
Jian-quan Li, Shenzhen (CN)

(73) Assignees: AAC Acoustic Technologies
(Shenzhen) Co., Ltd., Shenzhen (CN);
AAC Acoustic Technologies
(Chanzhou) Co., Ltd., Changzhou (CN)

(*) Notice: Subject to any disclaimer, the term of this patent is extended or adjusted under 35 U.S.C. 154(b) by 61 days.

(21) Appl. No.: 13/975,751

(22) Filed: Aug. 26, 2013

(65) Prior Publication Data
US 2014/0161289 A1 Jun. 12, 2014

(30) Foreign Application Priority Data
Dec. 12, 2012 (CN) .......................... 2012 1 0535223

(51) Int. Cl.
H04R 25/00 (2006.01)
H04R 19/04 (2006.01)
H04R 31/00 (2006.01)
B81B 7/00 (2006.01)
H04R 1/04 (2006.01)

(52) U.S. Cl.
CPC ............. H04R 19/04 (2013.01); B81B 7/0061 (2013.01); H04R 31/00 (2013.01); H04R 1/04 (2013.01); H04R 2201/003 (2013.01); Y10T 29/49005 (2013.01)

(58) Field of Classification Search
CPC ............. H04R 2201/1003; H04R 1/04; H04R 19/005; H04R 19/04
USPC .................................. 381/174, 175, 355, 360
See application file for complete search history.

(56) References Cited

U.S. PATENT DOCUMENTS

| 6,870,938 | B2* | 3/2005 | Takeuchi et al. | 381/175 |
| 8,443,084 | B2* | 5/2013 | Challa et al. | 709/226 |
| 8,472,648 | B2* | 6/2013 | Wang et al. | 381/175 |
| 8,837,754 | B2* | 9/2014 | Formosa et al. | 381/174 |
| 8,841,738 | B2* | 9/2014 | Harney et al. | 257/416 |
| 8,879,767 | B2* | 11/2014 | Wickstrom | 381/361 |
| 2008/0247587 | A1* | 10/2008 | Sato | 381/365 |
| 2013/0028450 | A1* | 1/2013 | Cortese et al. | 381/174 |
| 2013/0032936 | A1* | 2/2013 | Formosa | 257/704 |
| 2013/0161702 | A1* | 6/2013 | Chen | 257/254 |
| 2014/0045290 | A1* | 2/2014 | Horimoto et al. | 438/51 |

* cited by examiner

Primary Examiner — Curtis Kuntz
Assistant Examiner — Ryan Robinson
(74) Attorney, Agent, or Firm — IPro, Inc.; Na Xu

(57) ABSTRACT

A silicon condenser microphone is disclosed. The microphone includes a transducer, an IC chip, a first board, a second board spaced from the first board by a frame, and a third board located between the first board and the second board. A cavity is accordingly formed by the first board, the frame and the third board to accommodate the transducer and the IC chip. The IC chip is electrically connected to a surface of the third board facing the second board. The microphone provides an enlarged back volume to the transducer and provides the transducer with a shield against electro-magnetic interference. A manufacturing process is also disclosed.

15 Claims, 3 Drawing Sheets

SILICON CONDENSER MICROPHONE

FIELD OF THE INVENTION

This disclosure relates generally to a housing for a transducer. More particularly, this disclosure relates to a miniature silicon condenser microphone comprising a housing for shielding a transducer produced on the surface of a silicon die. The silicon die must be packaged to produce a functional microphone of this type.

DESCRIPTION OF RELATED ART

There have been a number of disclosures related to building microphone elements on the surface of a silicon die. Certain of these disclosures have come in connection with the hearing aid field for the purpose of reducing the size of the hearing aid unit. While these disclosures have reduced the size of the hearing aid, they have not disclosed how to protect the transducer from outside interferences. For instance, transducers of this type are fragile and susceptible to physical damage. Furthermore, they must be protected from light and electromagnetic interferences. Moreover, they require an acoustic pressure reference to function properly. For these reasons, the silicon die must be shielded.

As disclosed in U.S. Pat. No. 7,439,616, some shielding practices have been used to house these devices. For instance, insulated metal cans or discs have been provided. Additionally, DIPS and small outline integrated circuit (SOIC) packages have been utilized. However, the drawbacks associated with manufacturing these housings, such as lead time, cost, and tooling, make these options undesirable.

Therefore, it is desirable to provide an improved silicon condenser microphone which can overcome the above-mentioned problems.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Exemplary embodiments will herein be described in detail with the understanding that the present disclosure is to be considered as an exemplification of the principles of the present invention and is not intended to limit the broad aspect of the invention to the embodiment illustrated.

Figure 1:
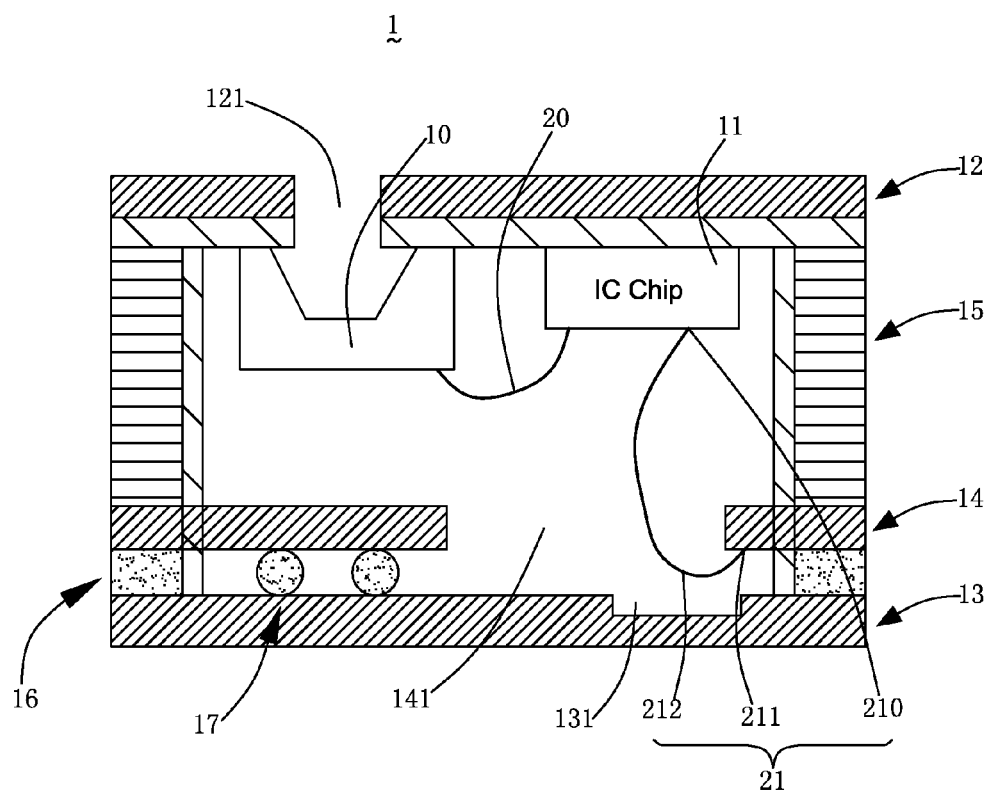
FIG. 1 is an illustrative cross-sectional view of a silicon condenser microphone in accordance with a first exemplary embodiment of the present disclosure.

Referring to FIG. 1, which is an illustrative cross-sectional view of a silicon condenser microphone 1 in accordance with an exemplary embodiment of the present disclosure, the silicon condenser microphone 1 includes a transducer 10, an IC chip 11, a first board 12, a second board 13, a third board 14, and a frame 15. The transducer 10 is a silicon-based transducer which may also be named as a Micro-Electro-Mechanical System (MEMS) die. The IC chip 11 is a signal processing unit for dealing with the signals produced by the transducer 10. The first, second, and third boards 12, 13, 14 are all provided with conductive traces.

The transducer 10 and the IC chip 11 are both mounted on the first board 12, and the third board 14 is located between the first board 12 and the second board 13. The first board 12 is spaced from the third board 14 by the frame 15, thus a cavity is formed accordingly by the first board 12, the third board 14 and the frame 15. The transducer 10 and the IC chip 11 are accommodated in the cavity. The second board 12 is assembled with the third board 14 by a plurality of jointing members. In this embodiment, the second board 13 is assembled with the third board 14 by a connecting means 16 aligned with the frame 15, and conductive glue 17 aligned with the cavity. Therefore, the second board 13 is electrically connected with the third board 14.

The third board 14 includes an opening 141 communicating with the cavity. The first board 12 further includes a sound aperture 121 which is covered by the transducer 10. The sound aperture 121 communicates with the cavity. Of course, the sound aperture may also be not covered by the transducer 10. The sound aperture 121 is used to transmit sound waves to the transducer 10. Therefore, even if the sound aperture 121 is not covered by the transducer 10, sound waves can also arrive at the transducer via the cavity.

The transducer 10 is electrically connected with the IC chip 11 by a first conductive member 20. When the sound waves arrive at the transducer 10, the transducer 10 will produce electrical signals which will be received by the IC chip 11. In this embodiment, the first conductive member 20 is a conductive wire. In fact, the transducer 10 could be connected to the IC chip by other feasible means. The IC chip 11 is electrically connected to the third board 14 by a second conductive member 21. The second conductive member 21 includes an end 210 electrically connected to the IC chip 11, another end 211 electrically connected to a surface of the third board 14 facing the second board 13, and a middle portion 212 passing through the opening 141 of the third board 14. In this embodiment, the second conductive member 21 is a conductive wire.

The second board 13 includes a recess 131 defined in a surface of the second board facing the third board 14. The recess 131 is located corresponding to the middle portion 212 of the second conductive member 21 for providing an extra space to the second conductive member 21.

The first board 12, the second board 13, and the frame 15 cooperatively form a housing of the silicon condenser microphone 1. The sound aperture is defined in the first board 12. However, the sound aperture could be defined in any place of the housing, as long as the sound aperture communicates with the cavity formed by the housing. In this embodiment, the first board, the frame, the second board, and the third board are separated elements. As an alternative, two or more of the first board, the frame, the second board, and the third board could be integrated as one piece.

Figure 2:
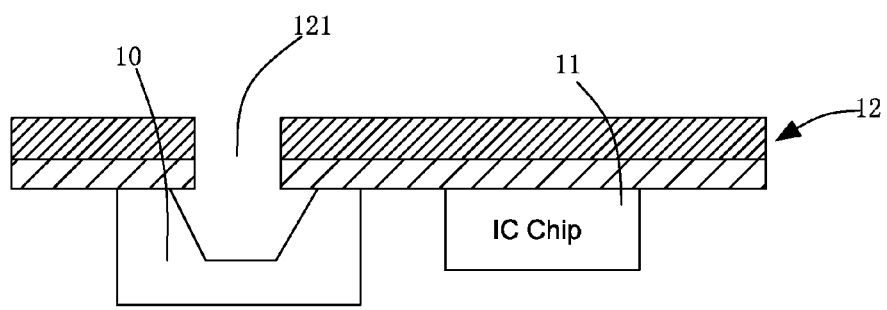
FIGS. 2-4 are illustrations showing the manufacturing processes of the silicon condenser microphone in FIG. 1.
Figure 3:
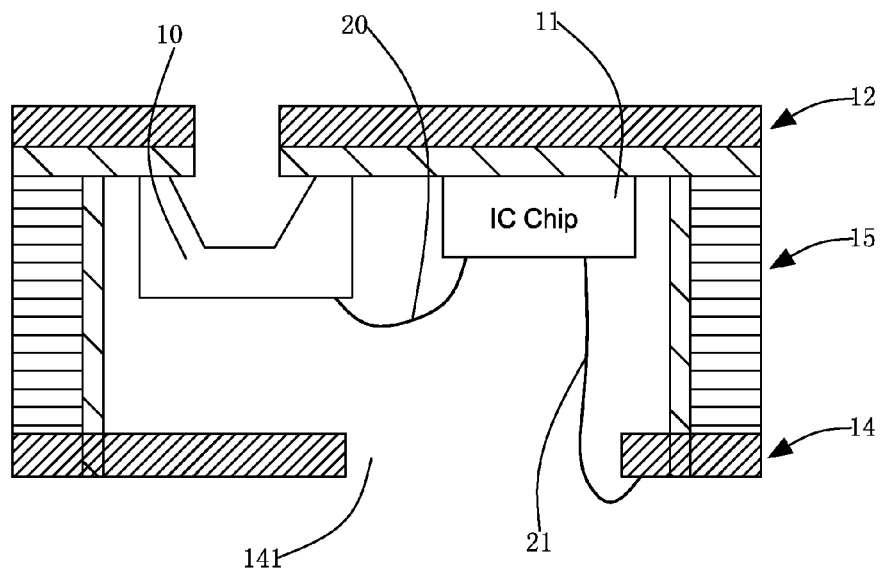
Figure 4:
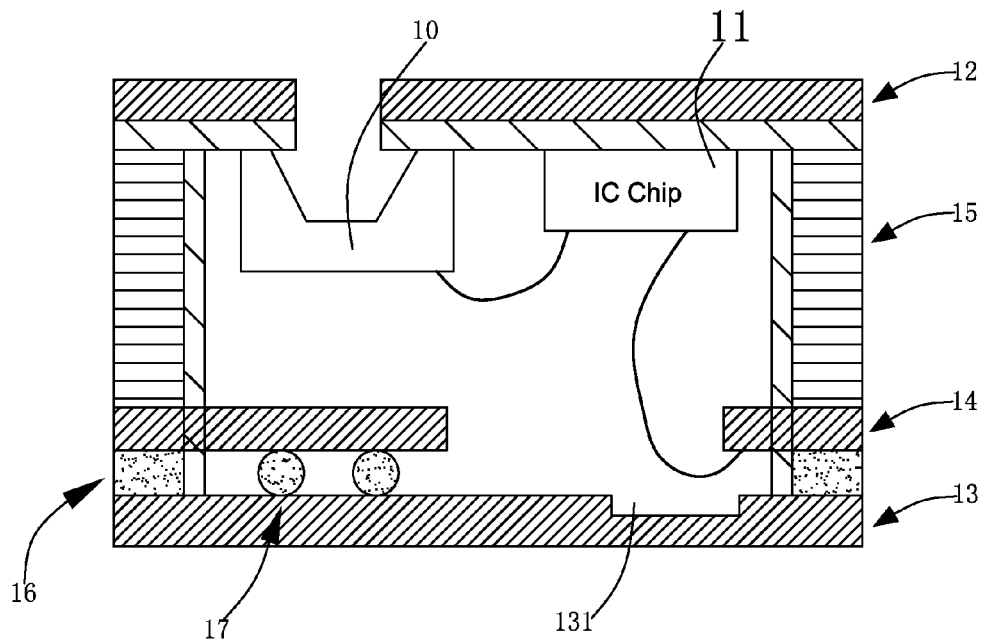

Refer to FIGS. 2-4, which are illustrations of manufacturing processes of the silicon condenser microphone. Basically, the manufacturing processes include the steps as follows:
  (a) Providing a first board 12 with a sound aperture 121 and a conductive trace;
  (b) Mounting a transducer 10 and an IC chip 11 on the first board 12, optionally, the transducer 1 covering the sound aperture 121;
  (c) electrically connecting the transducer 10 to the IC chip 11 by a first conductive member 20;

(d) Providing a third board 14 and a frame 15, and spacing the first board 12 from the third board 14 by the frame 15, one end of the frame 15 being connected with the first board 12, and another end of the frame 15 being connected with the third board 14 for forming a cavity accommodating the transducer 10 and the IC chip 11; the third board 14 being provided with an opening 141;

(e) electrically connecting the IC chip 11 to a surface of third board 14 by a second conductive member 21; the second conductive member includes one end connecting with the IC chip, another end connecting with the third board 14, and a middle portion passing through the opening 141, the two ends of the second conductive member being located at two sides of the third board 14;

(f) providing a second board 13 and assembling the second board 13 with the third board 14 by connecting means for locating the third board 14 between the first board 12 and the second board 14; the connecting means comprising a part aligned with the frame 15 and another part aligned with the cavity; the second board 13 being provided with a recess corresponding to the middle portion of the second conductive member 21 for providing an extra space to the second conductive member 21.

The sequence of the steps as described above is only an illustration showing a feasible process for manufacturing the silicon condenser microphone, and steps thereof may be adjusted forwardly or backwardly. The position of the sound aperture may be changed to other place according to actual requirement, for example, changed to the frame, or to the third board. In this embodiment, the transducer and the IC chip are both located on the first board. Alternatively, the transducer may be located on the first board, and the IC chip may be located on the third board.

Figure 5:
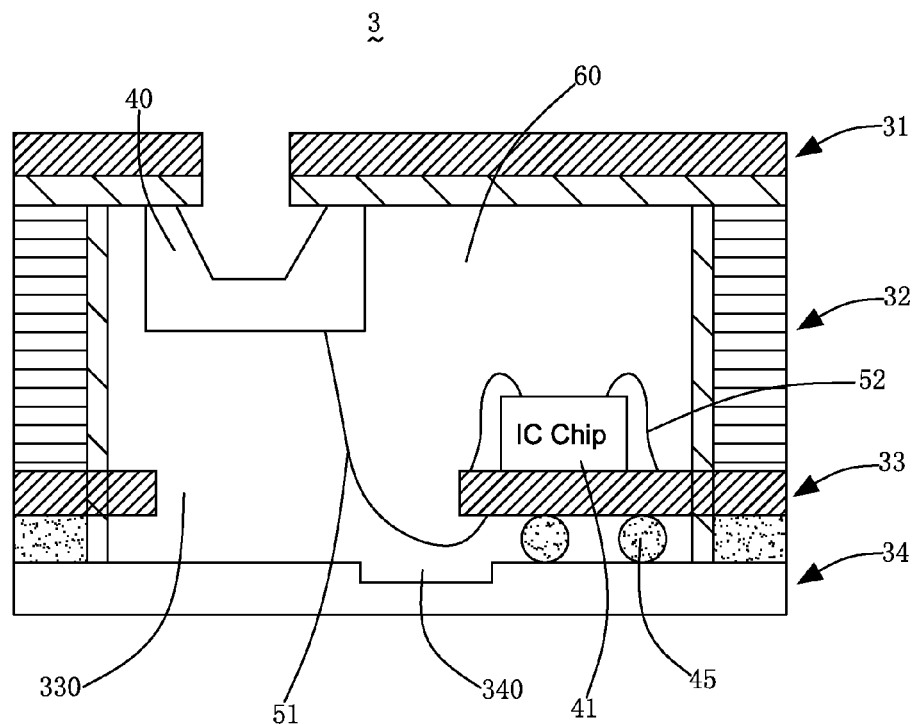
FIG. 5 is an illustrative cross-sectional view of a silicon condenser microphone in accordance with a second embodiment of the present disclosure.

Referring to FIG. 5, a silicon condenser microphone 3 in accordance with a second embodiment of the present disclosure includes a first board 31, a frame 32 integrated with the first board 31, a second board 33 assembled with the frame 32, a cavity 60 formed by the first board 31, the frame 32, and the second board 33, a third board 34 opposed to the second board 33, a plurality of conductive means 45 located between the second board and the third board for electrically connecting the second board 33 to the third board 34, a transducer 40 accommodated in the cavity 60, and an IC chip 41 accommodated in the cavity 60. The second board 33 is located between the first board 31 and the third board 34. The transducer 40 is mounted on the first board 31, and the IC chip 41 is mounted on the second chip 33. The second board 33 includes an opening 330 communicating with the cavity 60. The silicon condenser microphone 3 further includes a first conductive member 51 electrically connecting the transducer 40 to the second board 33 on a surface facing the third board 34 through the opening 330 of the second board 33. The IC chip 41 is electrically connected to the second board 33 by a second conductive member 52. The third board 34 further includes a recess 340 adjacent to the opening 330 for providing an extra space to the first conductive member 51. In this embodiment, the first board, the frame, the second board, and the third board are separated elements. As an alternative, two or more of the first board, the frame, the second board, and the third board could be integrated as one piece.

By virtue of the configuration described above, the silicon condenser microphone is provided with an enlarged back volume and the transducer accommodated therein is protected by the housing from electro-magnetic interference.

It will be understood that the above-mentioned particular embodiments are shown and described by way of illustration only. The principles and the features of the present disclosure may be employed in various and numerous embodiments thereof without departing from the scope of the disclosure as claimed. The above-described embodiment illustrates the scope of the disclosure but do not restrict the scope of the disclosure.

What is claimed is:

1. A silicon condenser microphone, comprising:
    a housing having a sound aperture, a first board, a second board, a frame spacing the first board from the second board, and a third board located between the first board and the second board;
    a cavity formed by the first board, the frame and the third board, the cavity communicating with the sound aperture;
    a transducer accommodated in the cavity and communicating with the aperture;
    an IC chip accommodated in the cavity and electrically connecting to the transducer;
    a first conductive member electrically connecting the transducer to the IC chip; and
    a second conductive member electrically connecting the IC chip to a surface of the third board facing the second board, wherein
    the third board includes an opening communicating with the cavity, the second conductive member includes one end connecting to the IC chip, another end connecting to the third board, and a middle portion passing through the opening of the third board.

2. The silicon condenser microphone as described in claim 1, wherein the transducer and the IC chip are both mounted on the first board.

3. The silicon condenser microphone as described in claim 1, wherein the transducer covers the sound aperture of the housing.

4. The silicon condenser microphone as described in claim 1, wherein the second board includes a recess corresponding to the middle portion of the second conductive member for providing an extra space to the middle portion.

5. The silicon condenser microphone as described in claim 1, wherein the third board electrically connects with the second board.

6. The silicon condenser microphone as described in claim 5 further including a plurality of connecting means aligned with the frame of the housing and conduction glue aligned with the cavity for connecting the third board to the second board.

7. A manufacturing process for making a silicon condenser microphone, comprising the steps of:
    providing a first board;
    providing a transducer electrically connecting with the first board and an IC chip electrically connecting with the transducer;
    providing a frame mounting on the first board;
    providing a third board mounting on the frame for forming a cavity, in which the transducer and the IC chip are accommodated, the third board including an opening;
    providing a conductive member electrically connecting one of the transducer and the IC chip to the third board via the opening, the conductive member including one end connecting to one of the transducer and the IC chip, another end connecting to the third board, and a middle portion passing through the opening of the third board;
    providing a second board assembled with the third board, a gap formed between the third board and the second board for accommodating a plurality of connecting means for electrically connecting the second board to the third board.

8. The manufacturing process as described in claim 7, wherein the transducer and the IC chip are both mounted on the first board.

9. The manufacturing process as described in claim 7, wherein the transducer is mounted on the first board and the IC chip is mounted on the third board.

10. The manufacturing process as described in claim 7, wherein the transducer is mounted on the first board and the first board includes a sound aperture covered by the transducer.

11. The manufacturing process as described in claim 7, wherein the second board includes a recess corresponding to the middle portion of the conductive member for providing an extra space to the middle portion.

12. A silicon condenser microphone, comprising:
a first board;
a frame extending from the first board;
a second board assembled with the frame;
a cavity formed by the first board, the frame and the second board;
a transducer accommodated in the cavity;
an IC chip accommodated in the cavity and electrically connected to the transducer;
a third board opposed to the second board and electrically connected with the second board by a plurality of conductive means located between the second and third boards, the second board being located between the first board and the third board;
a conductive member electrically connecting one of the transducer and the IC chip to the second board on a surface of the second board facing the third board, wherein
the second board defines an opening through which the conductive member connects one of the transducer and the IC chip to the third board.

13. The silicon condenser microphone as described in claim 12, wherein the third board forms a recess adjacent to the opening and providing an extra space to the conductive member.

14. The silicon condenser microphone as described in claim 12, wherein the transducer is mounted on the first board, and the IC chip is electrically mounted on the second board.

15. The silicon condenser microphone as described in claim 14, wherein the conductive member electrically connects the transducer to the second board, and the transducer is electrically connected to the IC chip via the second board.

* * * * *